(12) United States Patent
Freking et al.

(10) Patent No.: US 6,271,689 B1
(45) Date of Patent: Aug. 7, 2001

(54) FAST AND SMALL SERIAL VARIABLE LENGTH ENCODER WITH AN OPTIMALLY HIGH RATE FOR ENCODING INCLUDING HUFFMAN ENCODING

(76) Inventors: Robert Allen Freking, 2258 Timberlea Dr., Woodbury, MN (US) 55125-3001; Keshab K. Parhi, 27492 Avanti Dr., Mission Viejo, CA (US) 92692

( * ) Notice: Subject to any disclaimer, the term of this patent is extended or adjusted under 35 U.S.C. 154(b) by 0 days.

(21) Appl. No.: 09/526,671

(22) Filed: Mar. 16, 2000

(51) Int. Cl.$^7$ ................................................ H03M 7/40
(52) U.S. Cl. ................................................ 327/67; 327/65
(58) Field of Search .................. 341/65, 67; 714/779; 375/246, 253; 712/29; 382/246

(56) References Cited

U.S. PATENT DOCUMENTS

| | | | |
|---|---|---|---|
| 5,309,156 | * | 5/1994 | Fujiyama ........................... 341/67 |
| 5,404,138 | * | 4/1995 | Kim et al. ........................... 341/67 |
| 5,929,793 | * | 7/1999 | Choi ........................... 341/67 |

* cited by examiner

*Primary Examiner*—Tuan T. Lam

(57) ABSTRACT

A processing means is described for the variable-length encoding of digital signals. The resultant serial encoder admits symbols at data-dependent intervals and progressively releases one bit of encoded output each cycle. The encoder comprises storage, a shifter and a simple pattern tester. Excepting the pattern tester, no arithmetic operations are involved. These three parts are arranged such that processing speed is limited by the greater of the retrieval delay from storage and the delay of the pattern tester. This arrangement is made feasible by an implicit means of codeword length storage. Optimal encoding rates for a serial encoder may hereby be obtained.

6 Claims, 1 Drawing Sheet

FAST AND SMALL SERIAL VARIABLE LENGTH ENCODER WITH AN OPTIMALLY HIGH RATE FOR ENCODING INCLUDING HUFFMAN ENCODING

STATEMENT REGARDING FEDERALLY SPONSORED RESEARCH

Research for this invention was supported by the Army Research Office under grant number DAAG55-98-1-0203.

CROSS-REFERENCE TO RELATED APPLICATIONS

Not applicable.

BACKGROUND OF THE INVENTION

1. Field of the Invention

The present invention relates to the processing of digital data to effect variable-length encoding.

2. Description of Related Art

Variable-length coding (VLC) commands a dominant role in data compression as a result of its speed and simplicity. However, the very trends that commend its employ—the growth in data volume and increasing transmission rates—have preponderated to threaten its ability to palliate them. The art of VLC encoding has therefore focused on speed, yet with deference to circuit size.

A mapping between fixed-length input data, termed symbols, and variable-length output data, termed codewords, constitutes a codetable. The codetable singularly determines most of the structure, and consequently most of the performance characteristics, of an encoder. This codetable usually takes one of two forms: a compact tree-based arrangement or a larger direct tabulation. The tree-based arrangement was originally a decoding device, but has recently been transferred to the encoding domain. In support of decoding, its attributes are highly desirable. By contrast, the arrangement proves awkward with encoding. Much of the art has therefore attempted to reconcile it with encoding. This endeavor has met with only limited success. Some art mitigates the size advantage the arrangement suggests over direct tabulation. Other art requires post-encoding reversal operations that introduce undesirable variable latency between the output of the primary encoder and output of post-encoding hardware.

Direct tabulation, by virtue of its directness, should be fast. It is often not as compact as desired, though. Because codewords are variable in length, indication of the length of each codeword is required. This may be accomplished in a number of ways, all of which necessitate some concessions. For example, length may be stored explicitly alongside codewords, as an associated value of each symbol. This obviously consumes precious memory space. Alternatively, codewords of equal length may be grouped, with length and associated memory ranges specified separately. This approach restricts the type of code to which the encoder applies, e.g., the Huffman-Shannon-Fano code would be supported, but general Huffman codes would not. It also results in complex—and hence slow—processing.

Note that any scheme that explicitly stores a length value in any manner must employ arithmetic operations in releasing the recalled codeword to the output. Most often a unit decrement operation is utilized, reducing the length by one each time a bit of the codeword is output. Such an operation, while intrinsically simple, is often responsible for over half of the delay in a processing cycle.

SUMMARY OF THE INVENTION

The present invention describes a processing means for the variable-length encoding of digital signals. The resultant serial encoder admits symbols at data-dependent intervals and progressively releases one bit of encoded output each cycle. The encoder comprises storage, a shifter and a simple pattern tester. Excepting the pattern tester, no arithmetic operations are involved. These three parts are arranged such that processing speed is limited by the greater of the retrieval delay from storage and the delay of the pattern tester. This arrangement is made feasible by an implicit means of codeword length storage. Optimal encoding rates for a serial encoder may hereby be obtained.

OBJECTS AND ADVANTAGES OF THE INVENTION

It is a primary object and advantage of the present invention that optimal rates of operation may be obtained.

It is a significant object and advantage of this invention that memory requirements are low as a result of the avoidance of storage of explicit length information.

It is a clear advantage of this invention that composing parts are few and simple, and connections among parts are likewise trivial.

It is a strong advantage of this invention that formatting of variable-length codewords in larger fixed-length memory cells is trivially accomplished.

It is a noteworthy advantage of the present invention that the codes are online or offline reprogrammable since simple direct storage is employed. Because codes are not hardwired, as is sometimes done in the art, the invention has utility spanning both general and specific regimes. It is a definite advantage of this invention that output is delivered without post-encoding hardware, hence avoiding the imposition of additional latency in variable quantities.

DETAILED DESCRIPTION OF PREFERRED EMBODIMENT

Figure 1:
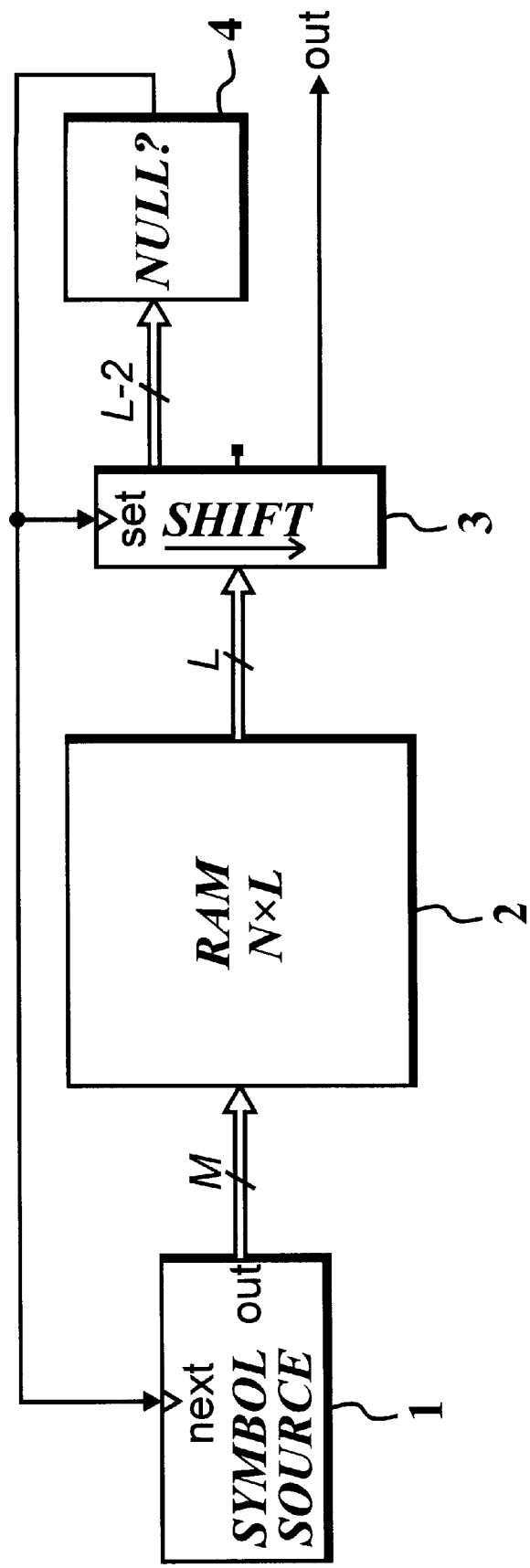
FIG. 1 illustrates the components and connections realizing the preferred embodiment of the encoder of this invention.

The preferred embodiment of this invention is shown in FIG. 1. The symbol source 1 is not part of the invention, per se, but is displayed to elucidate its operation. That symbol source 1 outputs a new M-bit symbol on the line OUT upon the raising of the input line NEXT. A random-access memory (RAM) 2 with N entries of length L receives this symbol, where $N=2^M$ and L is one bit larger than the maximum codeword length. The extra bit beyond the maximum codeword length is all that is necessary to implicitly indicate length. Therein lies the concision of this invention.

RAM 2 responds with the L-bit output associated with the input codeword. This then awaits entry into the shift register 3. Upon the raising of the input SET, the shift register 3 instantaneously admits the L-bit output of RAM memory 2. Note that the shift register is assumed to be edge triggered so that the L-bit output of the RAM 2 does not have the opportunity to change in response to a new symbol. Hence, the next symbol is always ready and waiting at the input of the shift register 3 immediately when set is raised.

The shift register 3 shifts its contents one bit toward the most significant position at the conclusion of each cycle. The most significant position is output in each cycle, thereby progressively expelling the codeword, in order, in traditional serial fashion. In each cycle the L-2 least significant bits are examined for nullity by the null tester 4. If these are null, the codeword has been completely output and the process repeats for a new codeword. It is well known that if null testing is implemented with tree-based logic and/or transmission gate logic, the resulting tester will be extremely fast. Note that the critical path—the processing path that determines the speed of operation—is limited by the maximum of the delay of the RAM 2 and the delay of the null tester 4. If the null tester 4 is fast, the RAM 2 limits the critical path, which is clearly an optimal situation since any mapping must include some sort of storage element. Certainly, in the case of a programmable device, that element must be RAM. If the null tester is slower, thus limiting the critical path, the situation is not necessarily non-optimal; it may be argued that any serial encoder must include a termination test since codewords are variable in length. The speed of the null test implementation, in comparison with other valid termination tests, therefore determines its optimality.

The RAM 2 is filled with variable length codewords, of which the lengthiest is L-1 bits long, expanded to fill all L bits. This is done by appending a punctuation bit with the value of one to the least significant end of the codeword. Further appending as many zeros as necessary to pad to the codeword and punctuation bit to fill all L bits completes the formatting. The shift register 3 replaces the evacuated least-significant position in each step with a zero. Therefore, when only the last bit of the codeword remains in the shift register, the L-2 least-significant bits consist of nothing but padding and replacement zeros. Accordingly, the null tester 4 will produce an affirmative result.

The role of the punctuation bit is simply to separate a codeword from padding. If it were not present the null tester 4 would produce spurious affirmatives if the codeword, by chance, ended in zeros.

Consider the code

| Symbol | Codeword |
|---|---|
| A | 0 |
| B | 10 |
| C | 110 |
| D | 1110 |
| E | 1111 |

Each codeword receives a punctuation bit and padding resulting in

| Symbol | Stored Datum |
|---|---|
| A | 01000 |
| B | 10100 |
| C | 11010 |
| D | 11101 |
| E | 11111 |

If codeword B were retrieved from memory, processing would proceed as were retrieved from memory, processing would proceed as

| Time | Shift Register | Output | L-2 l.s.b | Null? |
|---|---|---|---|---|
| 0 | 10100 | 1 | 100 | No |
| 1 | 01000 | 0 | 000 | Yes |

Hence, 1 0, the codeword for B, is output in two cycles.

If codeword D were retrieved from memory, processing would proceed as

| Time | Shift Register | Output | L-2 l.s.b | Null? |
|---|---|---|---|---|
| 0 | 11101 | 1 | 101 | No |
| 1 | 11010 | 1 | 010 | No |
| 2 | 10100 | 1 | 100 | No |
| 3 | 01000 | 0 | 000 | Yes |

Hence, 1 1 1 0, the codeword for D, is output in two cycles.

The particular code utilized above is for purposes of illustrating the operation of the preferred embodiment. As is clear from the discourse, the invention is not limited to any particular code, nor is this particular embodiment.

ADDITIONAL EMBODIMENT

The previous embodiment could be modified by replacing the RAM 2 with a read-only memory (ROM) if code programmability is not desired.

OTHER EMBODIMENTS

Other embodiments can be easily developed by changing elements as in the additional embodiment or by, for example, inverting the values of padding and punctuation and using a ones tester instead of a null tester 4. More complex bit patterns could also be used as padding so long as the punctuation interrupts any fortuitous occurrence of such patterns in the codewords. Many other similar variations are possible.

What is claimed is:

1. A machine for processing digital data into variable-length encoded data, comprising:
    (a) storage, storing a plurality of data, each of a predetermined fixed length and comprising:
        (1) a variable-length datum aligned at a predetermined edge,
        (2) punctuation, comprising at least one bit, appending said datum on the unaligned edge, and
        (3) padding bits, distinguishable from said punctuation, of a quantity that is the difference between said predetermined fixed length and the sum of the length of said punctuation and the length of said variable-length datum,
    (b) a translator which:
        (I) translates a fixed-length datum recalled from said storage by a predetermined number of bits per iteration, and
        (II) replaces evacuated bit positions with values distinguishable from said punctuation,
    (c) a pattern detector, which monitors said translator for the presence of padding bits over a predetermined range of bit positions,
    whereby said variable-length datum is extracted from said fixed-length datum without explicit storage of the length of variable-length datum thereof, and
    whereby variable-length encoding is effected.

2. The machine of claim 1 wherein:
    (a) said punctuation comprises one bit having a predetermined value,
    (b) said padding bits are of a homogeneous value opposite that of said predetermined value of said punctuation.

3. A method of processing digital data into variable-length data comprising:
- (a) storing a plurality of data, each of a predetermined fixed length and comprising:
  - (1) a variable-length datum aligned at a predetermined edge,
  - (2) punctuation, comprising at least one bit, appending said datum on the unaligned edge, and
  - (3) padding bits, distinguishable from said punctuation, of a quantity that is the difference between said predetermined fixed length and the sum of the length of said punctuation and the length of said variable-length datum,
- (b) translating a recalled fixed-length data by a predetermined number of bits per iteration, replacing evacuated bit positions with values distinguishable from said punctuation,
- (c) detecting patterns resulting from said translating for the presence of padding bits over a predetermined range of bit positions,
- whereby said ariable-length datum is extracted from said fixed-length datum without explicit storage of the length of variable-length datum thereof, and
- whereby variable-length encoding is effected.

4. The method of claim 3 wherein:
- (a) said punctuation comprises one bit having a predetermined value,
- (b) said padding bits are of a homogeneous value opposite that of said predetermined value of said punctuation.

5. A method of processing digital data into variable-length data comprising:
- (a) storing a plurality of data, each of a predetermined fixed length, prepared by a method comprising:
  - (b) aligning a variable-length datum at a predetermined edge,
  - (c) punctuating said variable-length datum on the unaligned edge with a punctuating datum at least one bit long, and
  - (d) padding with a quantity of bits, distinguishable from said punctuating datum, that is the difference between said predetermined fixed length and the sum of the length of said punctuating datum and the length of said variable-length datum,
  - (e) translating a recalled fixed-length data by a predetermined number of bits per iteration, replacing evacuated bit positions with values distinguishable from said punctuating datum,
  - (f) detecting patterns resulting from said translating for the presence of bits admitted by said padding over a predetermined range of bit positions,
- whereby said variable-length datum is extracted from said fixed-length datum without explicit storage of the length of variable-length datum thereof, and
- whereby variable-length encoding is effected.

6. The method of claim 3 wherein:
- (a) said punctuating is accomplished with one bit of a predetermined value, and
- (b) said padding is accomplished with homogeneous bits of a value opposite that of said predetermined value of bit used in said punctuating.

* * * * *